(12) United States Patent
Long et al.

(10) Patent No.: US 7,318,962 B2
(45) Date of Patent: Jan. 15, 2008

(54) MAGNETICALLY DIRECTED SELF-ASSEMBLY OF MOLECULAR ELECTRONIC JUNCTIONS COMPRISING CONDUCTIVELY COATED FERROMAGNETIC MICROPARTICLES

(75) Inventors: David P. Long, Ashburn, VA (US); James G. Kushmerick, Owings, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 276 days.

(21) Appl. No.: 11/044,197

(22) Filed: Jan. 28, 2005

(65) Prior Publication Data

US 2006/0172126 A1   Aug. 3, 2006

(51) Int. Cl.
| | |
|---|---|
| *H01F 3/10* | (2006.01) |
| *H01L 35/04* | (2006.01) |
| *B32B 5/16* | (2006.01) |
| *H01L 35/10* | (2006.01) |
| *H01L 25/44* | (2006.01) |

(52) U.S. Cl. .................... 428/566; 257/41; 257/762; 257/772; 257/787; 257/E23.06; 428/403; 439/287

(58) Field of Classification Search ............... 257/787, 257/E23.06, 41, 692, 762, 772; 439/287; 428/403, 566
See application file for complete search history.

(56) References Cited

U.S. PATENT DOCUMENTS 5,617,071 A * 4/1997 Daughton ................. 338/32 R
5,702,831 A * 12/1997 Chen et al. ................. 428/611
6,911,682 B2 * 6/2005 Rueckes et al. ............ 257/202
2001/0055685 A1 * 12/2001 Kaneyoshi .................. 428/403

OTHER PUBLICATIONS

Blum, "Molecularly inherent voltage-controlled conductance switching," Nature Materials, 4, 167 (Jan. 16, 2005).
Long et al, "Magnetically Directed Self-Assembly of Carbon Nanotube Devices", Advance Materials, May 17, 2004, vol. 16, No. 9-10, pp. 814-819.
Love et al, "Fabrication and Wetting Properties of Metallic Half-Shells With Submicron Diameters", American Chemical Society-Nano Letters, 2002, vol. 2, No. 8, pp. 891-894.
Choi et al, "Patterned Fluorescent Particles as Nanoprobes for the Investigation of Molecular Interactions", American Chemical Society-Nano Letters, 2003, vol. 3, No. 8, pp. 995-1000.
Hirohata et al, "Magnetic Domain Studies of Permalloy Wire-Based Structures With Junctions", IEEE Transaction on Magnetics, Sep. 2000, vol. 36, No. 5, pp. 3068-3070.
Kirk et al, "Switchingfields and Magnetostatic Interactions of Thin Film Magnetic Nanoelements", Applied Physics Letter, Jul. 1997, vol. 71, No. 4, pp. 539-541.

(Continued)

*Primary Examiner*—H. T Le
(74) *Attorney, Agent, or Firm*—Joseph T. Grunkemeyer; John J. Karasek

(57) ABSTRACT

A device having a substrate, a pair of ferromagnetic leads on a surface of the substrate, laterally separated by a gap, and one or more ferromagnetic microparticles comprising a conductive coating at least partially within the gap. The conductive coating forms at least part of an electrical connection between the leads. A molecular junction may connect the leads to the microparticle.

10 Claims, 5 Drawing Sheets

OTHER PUBLICATIONS

Salomon et al, "Comparison of Electronic Transport Measurements on Organic Molecules", Advance Materials, Nov. 2003, vol. 15, No. 22, pp. 1881-1890.

Kushmerick et al, "Effect of Bond-Length Alternation in Molecular Wires", Journal American Chemical Society, 2002, vol. 124, No. 36, pp. 10654-10655.

Kushmerick et al, "Conductance Scaling of Molecular Wires in Parallel", American Chemical Society-Nano Letters, 2003, vol. 3, No. 7, pp. 897-900.

Cai et al, "Nanowire-Based Molecular Monolayer Junctions: Synthesis, Assembly and Electrical Characterization", Journal Physical Chemical Society, 2004, vol. 108, No. 9, pp. 2827-2832.

Klein et al, "An Approach to Electrial Studies of Single Nanocrystals", Applied Physics Letter, Apr. 1996, vol. 68, No. 18, pp. 2574-2576.

Amlani et al, "An Approach to Transport Measurements of Electronic Molecules", Applied Physics Letters, Apr. 2002, vol. 80, No. 15, pp. 2761-2763.

* cited by examiner

MAGNETICALLY DIRECTED SELF-ASSEMBLY OF MOLECULAR ELECTRONIC JUNCTIONS COMPRISING CONDUCTIVELY COATED FERROMAGNETIC MICROPARTICLES

BACKGROUND OF THE INVENTION

1. Field of the Invention

The invention relates generally to a molecular electronic junction.

2. Description of the Prior Art

Electronic devices based on the electronic characteristics of small assemblies of active molecules (commonly referred to as molecular electronics) have the potential of exceeding the expected scaling limits foreseen by many as a looming barrier to Moore's Law.

A formidable challenge to the realization of molecular electronics is the development of high-throughput techniques for assembling nanoelectronic devices on a scale competitive with established complementary metal-oxide-semiconductor (CMOS) processes. Also needed are reliable methods capable of addressing each nanoscale unit with electrodes in such a way as to not alter or damage the active species during the assembly process. Therefore, an important step towards practical molecular electronic device fabrication is the development of a "soft" self-assembly processes which combine high yield with parallel assembly and establish contact between all nanostructures and patterned electrodes in a process which does not damage the active molecular unit.

SUMMARY OF THE INVENTION

The invention comprises a device comprising a substrate, a pair of ferromagnetic leads on a surface of the substrate, laterally separated by a gap, and one or more ferromagnetic microparticles comprising a conductive coating at least partially within the gap. The conductive coating forms at least part of an electrical connection between the leads.

The invention further comprises a method of making a device comprising the steps of: providing a substrate comprising a pair of ferromagnetic leads on a surface of the substrate, laterally separated by a gap; providing a dispersion of one or more ferromagnetic microparticles comprising a conductive coating; contacting the dispersion to the gap; and applying a magnetic field to the substrate, whereby the one or more microparticles are deposited in the gap to form at least part of an electrical connection between the leads.

The invention further comprises a particle comprising a microsphere, a ferromagnetic coating on the microsphere, and a conductive coating on the ferromagnetic coating. The ferromagnetic coating and the conductive coating cover only one hemisphere of the microsphere.

The invention further comprises a method of making a particle comprising the steps of: proving a plurality of microspheres; forming a close-packed monolayer of the microspheres on a substrate; placing a ferromagnetic coating on the hemispheres of the microspheres facing away from the substrate; and placing a conductive coating on the ferromagnetic coating.

BRIEF DESCRIPTION OF THE DRAWINGS

A more complete appreciation of the invention will be readily obtained by reference to the following Description of the Example Embodiments and the accompanying drawings.

DETAILED DESCRIPTION OF THE EXAMPLE EMBODIMENTS

In the following description, for purposes of explanation and not limitation, specific details are set forth in order to provide a thorough understanding of the present invention. However, it will be apparent to one skilled in the art that the present invention may be practiced in other embodiments that depart from these specific details. In other instances, detailed descriptions of well-known methods and devices are omitted so as to not obscure the description of the present invention with unnecessary detail.

A technique is disclosed for fabricating molecular junctions based on magnetic directed assembly of metallized silica beads. Magnetic entrapment exploits micron to nanoscale magnetic fields induced at engineered focal points within a ferromagnetic array to direct the deposition of susceptible species to the high-field region generated between pre-defined contacts. Magnetically-driven self-assembly can impart desirable properties to device fabrication such as high yield, accurate placement, and predictable orientation for deposited species. Magnetic entrapment can be used for the controlled deposition of metallized silica colloid into features functionalized with self-assembled monolayers (SAMs). Well-defined species which are inherently non-responsive towards magnetic entrapment can be made to undergo this simple process of self-assembly and form reliable molecular junctions using a non-aggressive technique which does not damage the organic monolayer.

Fabrication of reliable molecular junctions via magnetic assembly can be facilitated by deposited species that are attracted to regions of locally intense magnetic fields, electrically conductive, and nearly identical in size and shape.

Figure 1:
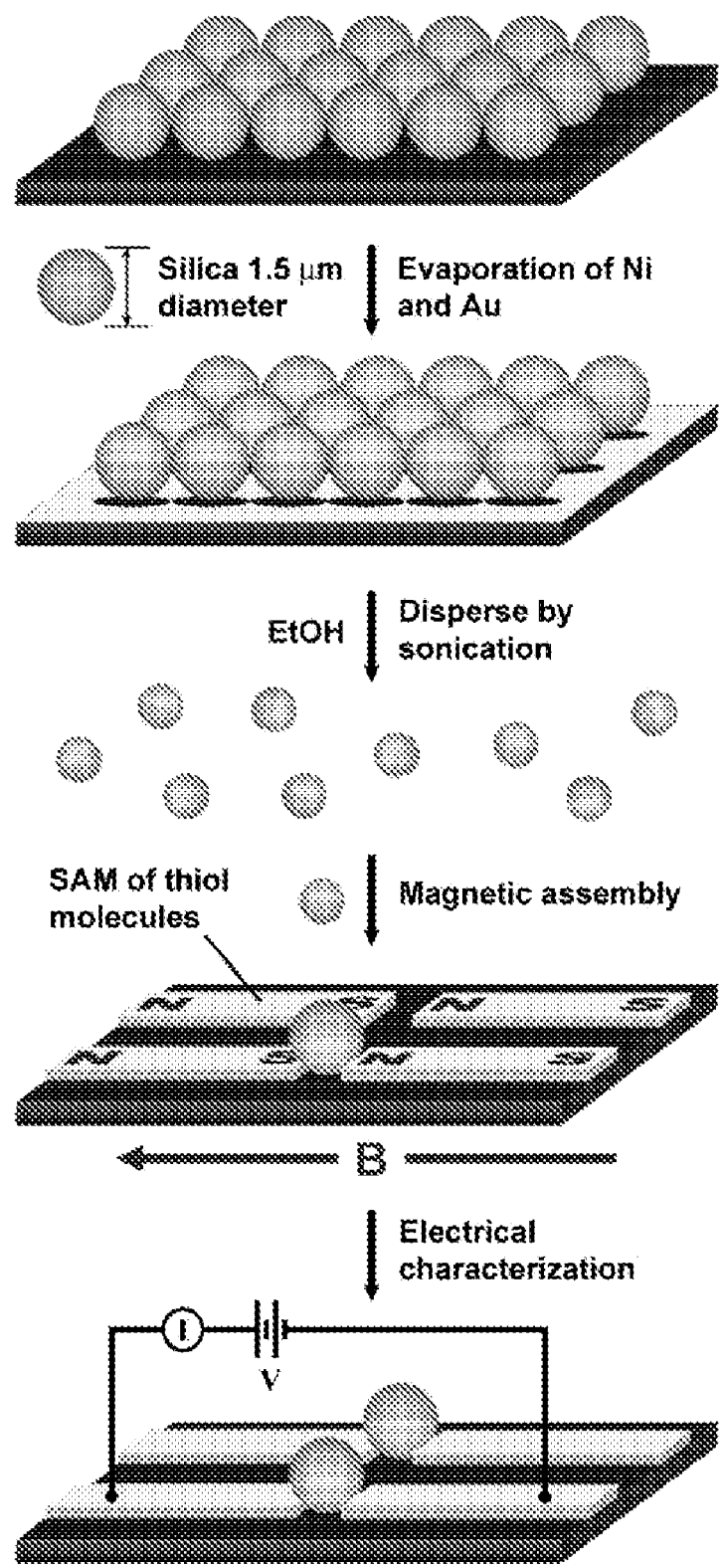
FIG. 1 schematically shows a process for making the device of the invention.

FIG. 1 illustrates a procedure used to fabricate and magnetically deposit the microspheres. In one step of the process of making the device, a substrate comprising a pair of ferromagnetic leads on a surface of the substrate, laterally separated by a gap is provided. Such a substrate 10 is shown in FIG. 1. An example substrate is silicon. An example leads is permalloy metal with a gold coating. The gap may be, but is not limited to, no more than about 5 μm wide. Methods of placing such leads on a substrate are known in the art, including, but not limited to, lithography.

There can also be a plurality of pairs of leads on the substrate. Such pairs may be arranged in a grid. High aspect-ratio features promote alignment of magnetic domains parallel with the long axis of each device and minimizes flux-closed domain configurations which reduce overall field strength within the magnetic trap.

In another step of the process, a dispersion of one or more ferromagnetic microparticles comprising a conductive coating is provided. The dispersion is a means for delivering the microparticles to the leads and may be prepared by sonicating the microparticles in a liquid. The microparticles may be larger, including slightly larger than the width of the gap.

An example particle has three parts: a microspherical core, which may be silica; a ferromagnetic coating, which may be nickel, on the core; and a conductive coating, which may be gold, on the ferromagnetic coating. The silica may be colloidal silica of no more than 5 µm in diameter. Silica colloid may be used for this process as they are inert, available in a broad range of diameters, and obtained with narrow size distributions. The term "microsphere" also includes smaller particles such as nanospheres. The coatings may cover only a single hemisphere of the core. This is the natural result of a certain method of making such microparticles. Such particles may be made by forming a hexagonal close-packed monolayer of the microspheres on a substrate, then placing the ferromagnetic and conductive coatings on the microspheres. The coatings are formed on only the hemisphere facing away from the substrate.

Fabrication of electrically conductive and magnetically susceptible silica colloid may be accomplished through evaporative metallization techniques. The hemispherical-metallization of microspheres has been previously demonstrated by the physical evaporation of gold onto hexagonal close-packed arrays of colloid monolayers. (Love et al., *Nano Lett.*, 2, 891 (2002); Choi et al., *Nano Lett.*, 3, 995 (2003). All referenced publications and patents are incorporated herein by reference.) The ferromagnetic layer of nickel provides the magnetic handle needed to manipulate the resulting colloid from a solution-based suspension while the thin gold overcoat yields an oxide-free surface for charge transport into an organic monolayer.

In this technique, the silica sphere acts as an inert template for the metal layers conforming to their surfaces permitting the fabrication of nearly identical magnetic and electrically conductive building blocks for magnetic assembly. This method may be extended to include a number of inert species which are uniform in size and shape in order to render them magnetically susceptible for controlled deposition into a proximal probe test-bed.

Once the substrate and dispersion are provided, the dispersion is contacted to the gap between the leads. The dispersion may also contact other parts of the substrate. This may be performed as simply as immersing the substrate in the dispersion, or placing a drop or puddle of the dispersion on the substrate.

While the dispersion is in contact with the gap, a magnetic field is applied to the substrate. The field can cause one or more microparticles to be deposited in the gap. When using half-coated microspheres, the field tends to orient the sphere with the conductive coating contacting both leads to form at least part of an electrical connection between the leads. Other kinds of microparticles may not need such orientation, however, the magnetic field in combination with the ferromagnetic property of the leads still serves to place the microparticles into the gap. Deposition of the microparticles may be more efficient when the magnetic field is approximately parallel to the leads. An example magnetic field strength in 100G, however, different systems may require different alignment field strengths.

Figure 2:
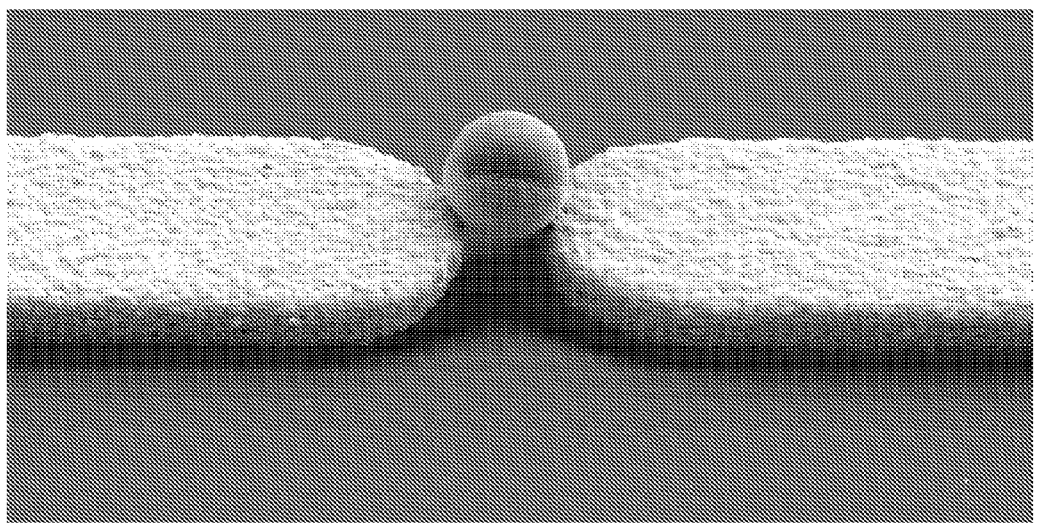
FIG. 2 shows a scanning electron microscopy (SEM) micrograph of a properly aligned microsphere in a gap.

By magnetically controlling the face of the colloid which points into each device, this technique is able to promote electrical contact across source and drain electrodes despite half of the bead being non-conductive. Control over orientation of the sphere is expected to occur via magnetic interactions between the underlying ferromagnetic layer, the externally applied magnetic field, and the localized magnetism being generated in each device. FIG. 2 shows an SEM micrograph of a properly aligned microsphere in a gap.

When the microparticles are larger than the gap, it is possible to achieve a high yield of devices having only a single microparticle spanning the gap, in contact with both leads. This allows for consistency among multiple devices.

The resulting device, which may be made by other methods, can optionally include electrically active molecules. Such molecules may have a function as part of a circuit. The molecules form a monolayer in contact with a lead and the microparticle. This may be made by the presence of a monolayer of the molecules on the lead before the microparticle is deposited into the gap. This allows for a molecular junction to be formed across a junction that is longer than the molecules themselves.

In one embodiment, both leads are coated with the molecules, which are in contact with a single particle in the gap. The molecules may comprise one or more sulfur atoms bound to a gold coating on the microparticle, the leads, or both. Suitable molecules include, but are not limited to, a compound having conjugated bonds, 1-undecanethiol, oligo(phenylene vinylene)dithiol, and oligo(phenylene ethynylene)dithiol. In another embodiment the microparticles are coated with the molecules.

Figure 3:
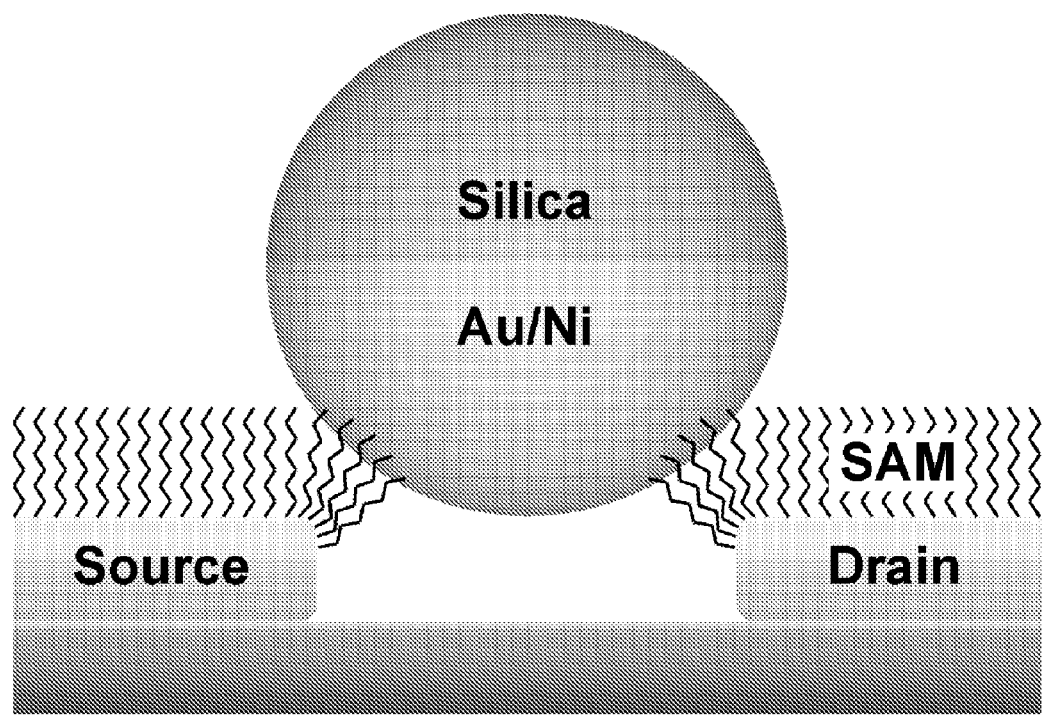
FIG. 3 schematically illustrates molecular junctions to the microsphere.

Similar to previous methods of particle entrapment for charge transport analysis in organic films, the method can produce two molecular junctions in series as illustrated in FIG. 3. However, the use of magnetic entrapment offers in addition to this a controlled "bottom-up" self-assembly process which does not require alternating electric fields, individually addressing devices to initiate deposition, e-beam lithography, or high temperatures. Since all potential molecular candidates for memory applications include chemical functionality and bond structure important for specific electronic responses, the use of magnetic entrapment to assemble such devices becomes attractive due to its ability to accurately place conductive units in intimate contact with organic monolayers without using harsh chemicals or processes which may erode or alter the SAM. Also, since magnetic entrapment performs well as a parallel technique this method has the potential to generate a large number of devices simultaneously in a wafer-level assembly process. Due to the small contact area achieved through the use of relatively large micron-scale spherical beads, this method can provide a simple means to fabricate nanoscale devices using high-throughput optical lithography.

Having described the invention, the following examples are given to illustrate specific applications of the invention. These specific examples are not intended to limit the scope of the invention described in this application.

EXAMPLE 1

Formation of microspheres—2-D close-packed hexagonal monolayers of 1.5 micron silica beads were formed on 100 mm diameter silicon wafers by the slow evaporation of an ethanol dispersion of the colloid (Bangs Laboratories). Three prepared wafers were mounted simultaneously in an evaporative metallization chamber. 50 nm of nickel was deposited evenly on all wafers followed by 10 nm of gold. Following metallization, 100 mL of absolute ethanol was placed in a large beaker and the prepared wafers were added individually. Mild sonication for 20 min in a bath sonicator completely removed all metallized beads from the silicon surface creating a dark grey ethanol dispersion of the beads. All three wafers were stripped of their beads using the same dispersion. This concentrated "stock" solution was sonicated for another 20 minutes followed by removal of 0.5 mL of the dark dispersion. This aliquot was diluted to 100 mL with ethanol and again sonicated for 30 minutes. Approximately 10 mL of this dilution was used for each run of microsphere deposition after briefly sonicating.

Analysis by scanning electron microscopy (SEM) confirmed the hemisphere of the colloid which faced into the deposition was covered with a thin deposit of metal while the "underside" remained uncoated. In an SEM image of one of these prepared 1.5 μm diameter metallized silica spheres, the metallized and non-metallized regions were plainly visible and found to occupy distinct hemispheres on the sphere.

EXAMPLE 2

Magnetic self-assembly—The magnetic self-assembly of metallized colloid was conducted using arrays of high-aspect ratio devices composed of electroplated permalloy metal ($Ni_{80}Fe_{20}$), the fabrication of which is described in Long et al., *Adv. Mater.*, 16, 814 (2004). Features were encased in a thin layer of electroless gold to permit thiol monolayer formation on the surface of the electrodes. Each device incorporated a set of probe tips separated by a 1 μm gap where a locally intense magnetic field would direct entrapment of the microspheres. The specific combination of a 1 μm gap width and 1.5 μm diameter colloid was carefully chosen to prevent the spheres from fitting properly in the gaps. This forces electrical contact to be made further into the metallized region of the sphere where the deposited Ni/Au film is more continuous.

Approximately 3 ml of freshly sonicated microsphere dispersion was placed in a small test tube. The test tube was then placed in a 100 Gauss magnetic field generated by two rare-earth magnets at a fixed distance from each other. Substrates containing prepared device arrays were dropped into the test tube and a timer started. The tube was turned to ensure the long axis of the permalloy devices was parallel with the external alignment field and trapping was allowed to proceed for 7.0 minutes. The tube was then removed from the magnetic field and the bead solution poured out. The substrate was then rinsed several times with ethanol to remove excess colloid from the surface. Substrates were then gently dried with a stream of carbon dioxide or nitrogen and placed under vacuum until electrical analysis was performed.

Trapping conditions were optimized for the arrays and specific colloid concentration. Best results were obtained when the ferromagnetic core of each device was additionally aligned using an external magnetic field (100 Gauss) during the trapping process. Trapping was performed for 7 minutes followed by rinsing with ethanol and drying each substrate before analysis. Efficiency for single-bead entrapment was found to be approximately 60%, while 20-30% resulted in 2-3 beads per device, and 10-20% yielded no beads. When single-bead junctions were not required, a yield of 100% could be readily obtained by increasing trapping time but resulted in multiple beads per device. SEM confirmed the metallized hemisphere of the trapped colloid was oriented preferentially towards the high-field region induced between the electrodes.

EXAMPLE 3

Current-voltage analysis—Room temperature current-voltage (I-V) analysis was conducted on non-functionalized microsphere junctions to determine the electrical properties of the metal-metal contacts generated using this technique. Improper bead orientation after trapping prevents electrical current through the device, however the majority of trapped beads display a preferred magnetic orientation which promotes electrical contact. Proper alignment of the colloid completes the circuit across the probe tips. I-V analysis of several such junctions revealed contact resistance from 100-600 Ω, similar to reports of assembled metallic nanowires. The instrument compliance was set at 1 μA. The range of microsphere junction resistance is thought to be due to the exact positioning of the sphere and its manner of contact with the electrodes. Electrical contacts made near the edge of the metallized and silica regions were found to be of higher resistance due to lower thickness of the deposited metal film.

EXAMPLE 4

Deposition of monolayers—Substrates containing gold-coated permalloy features were cleaned using 30% $H_2O_2$ for 30 minutes followed by deionized water and ethanol rinses. Substrates were then exposed to $UV/O_3$ treatment for 10 minutes and thoroughly rinsed again in ethanol and dried in a stream of nitrogen. A self-assembled monolayer of C-11, OPE, or OPV (shown below) were then deposited on the gold-coated electrodes by immersion for 24-48 hours in a 1 mM solution of the compound in either ethanol or tetrahydrofuran. Monolayers of OPE and OPV were deposited as the dithiolacetates and base-deprotected immediately before SAM formation using ammonium hydroxide. OPE and OPV were handled and deposited under the inert atmosphere of a nitrogen glove box. After self-assembly of the monolayer, the substrates were rinsed with ethanol and dried in nitrogen/vacuum.

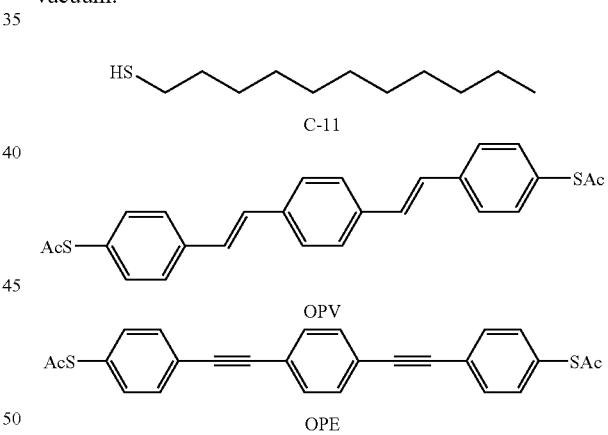

EXAMPLE 5

Figure 4:
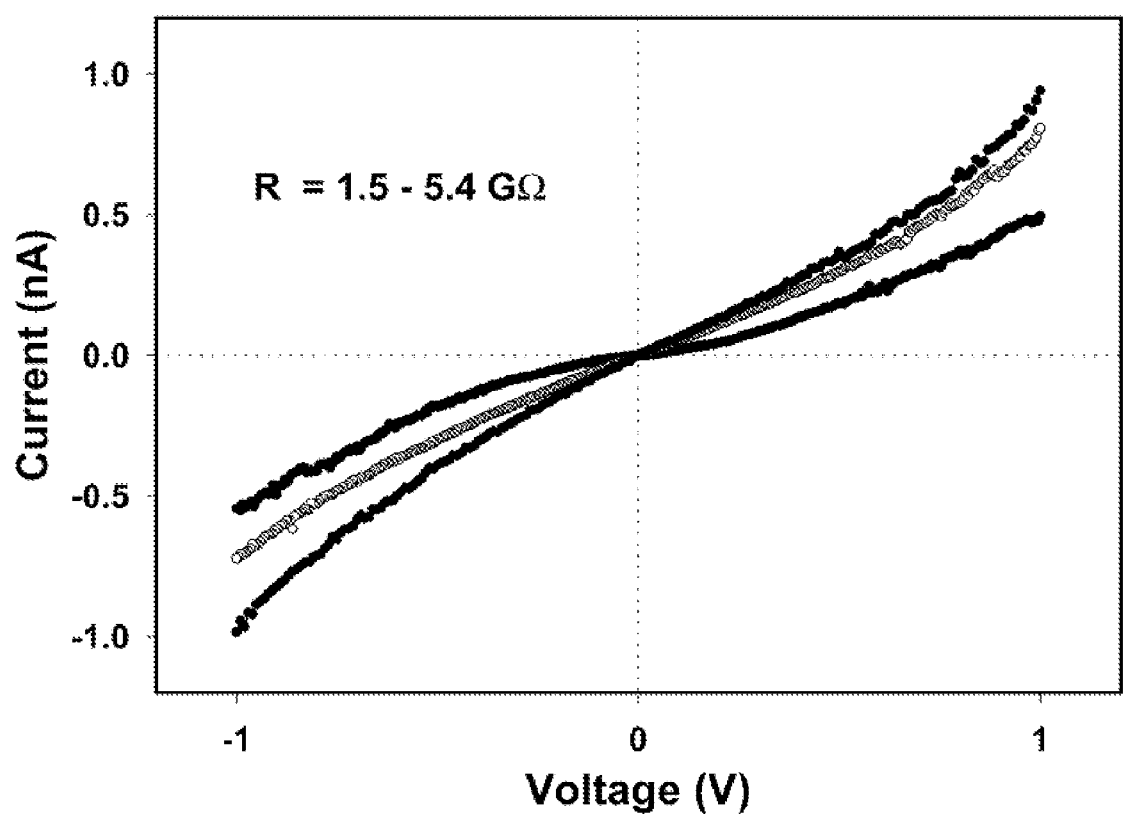
FIG. 4 shows a current-voltage (I-V) plot of three discrete microsphere junctions.

Current-voltage analysis with monolayers—The I/V characteristics of microsphere junctions fabricated using electrode arrays functionalized with various classes of self-assembled monolayers were examined. The specific molecules are shown above and represent species ranging from electrical insulators to prototypical molecular wires with extensive π-conjugated systems. FIG. 4 shows a plot of three discrete microsphere junctions incorporating 1-undecanethiol (C-11) monolayers. Single-bead microsphere junctions were found to yield room temperature current-voltage measurements indicative of electron tunneling with conductance ranging from 0.5-1.0 nA at 1 V bias. Zero-bias resistance was calculated from the slope of the linear I-V segment between ±0.1 V and averaged $3.5 \times 10^9$ Ω (3.5 GΩ). Junctions were generally stable up to ±2 V but would deteriorate rapidly at increasing bias. Comparison of these results to previous measurements on alkanethiol systems allowed for estimating of the number of C-11 molecules the microsphere junctions incorporate. Based on reported C-11 conductance of 1.3 pA/molecule at 0.5 V, it is estimated that 1.5 micron diameter microspheres address approximately 300 C-11 molecules per contact (two contacts per sphere). These values scale appropriately to results from 10 μm diameter crossed-wire test-beds reported to address ~1000 molecular units. Since microsphere junction area is dependant on the radius and curvature of the sphere trapped, use of smaller silica colloid could be used to lower the contact area achieved with this technique and further reduce the number of molecules analyzed. The entrapment of multiple beads per device (usually no more than 2-3) occasionally led to the formation of parallel molecular junctions. In these instances SEM was used to determine the number of successful contacts made by the beads and compared to I-V characterization of the junction. In parallel microsphere junctions conductance increased linearly with the number of colloids making contact across the electrodes.

Figure 5:
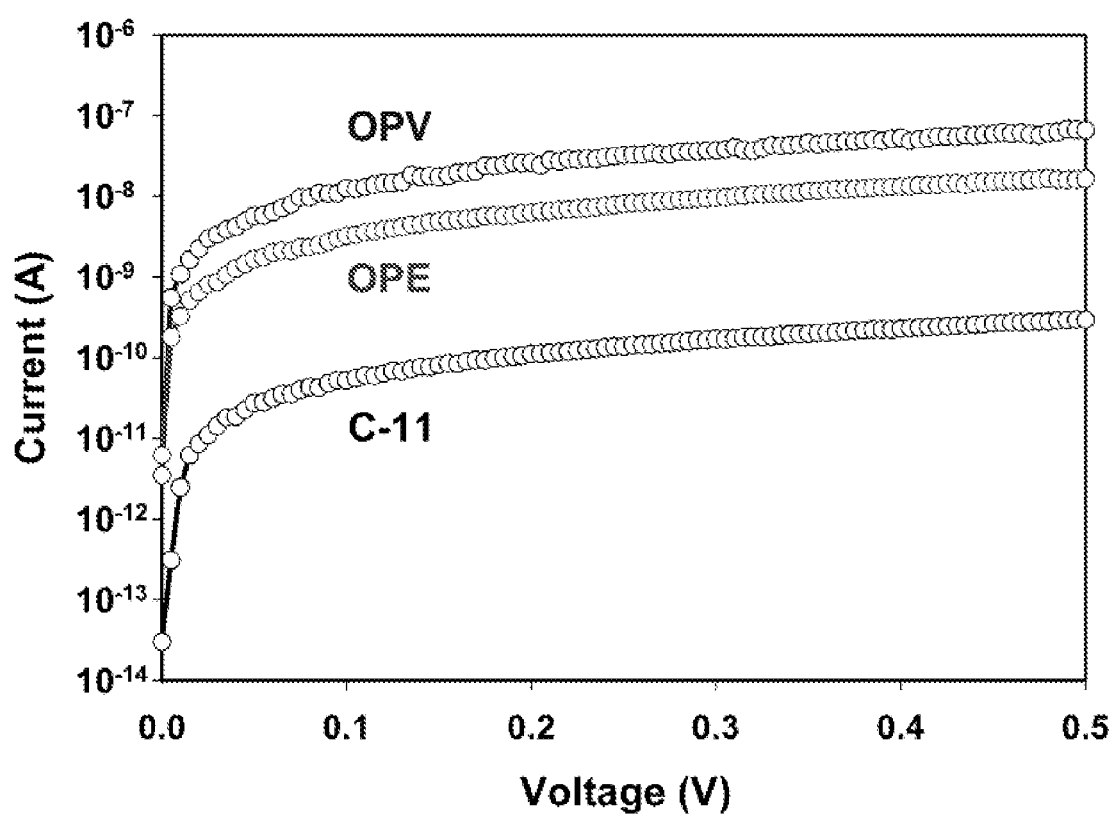
FIG. 5 shows I-V analysis of oligo(phenylene ethynylene) dithiol (OPE) and oligo(phenylene vinylene)dithiol (OPV) single-bead microsphere junctions.

The electrical properties of microsphere junctions incorporating monolayers of oligo(phenylene ethynylene)dithiol (OPE) and oligo(phenylene vinylene)dithiol (OPV) were examined. Unlike alkanethiols, the unsaturated backbone of oligo(phenylene) derivatives contain π-conjugation which extends between the thiol end groups of each molecule yielding electron transport properties typical of organic conductors. Monolayers of OPE and OPV were deposited as the dithiolacetates and base-deprotected using ammonium hydroxide immediately before SAM formation. Microsphere junctions were magnetically self-assembled as before (100 G/7 mm.) followed by vacuum annealing to promote thiol-gold bond formation on the Au/Ni hemisphere of the trapped colloid and minimize junction resistance. FIG. 5 shows I-V analysis of OPE and OPV single-bead microsphere junctions plotted with C-11 data from FIG. 4 for comparison. The overall trend in conductance follows C-11<<OPE<OPV as expected for an insulating alkanethiol verses π-conjugated molecules. Junctions incorporating the π-conjugated OPE and OPV monolayers were found to conduct nearly two orders of magnitude more current than those containing the insulating alkanethiol. OPE microsphere junctions conduct approximately 40 nA at 1 V bias and were calculated to have a zero-bias resistance (±0.1 V) of 33.4 MΩ Typical junctions incorporating monolayers of OPV conducted approximately 4 × as much current as OPE and averaged a zero-bias resistance of approximately 10.3 MΩ. The trends observed here are in excellent agreement with previous measurements on these classes of molecules using crossed-wire test-beds, scanning tunneling microscopy (STM) experiments, nanowire-based molecular junctions, and theoretical studies. The consistency of results found between these past reports and current microsphere molecular junctions validate this new technique as useful for molecular transport measurements.

Figure 6:
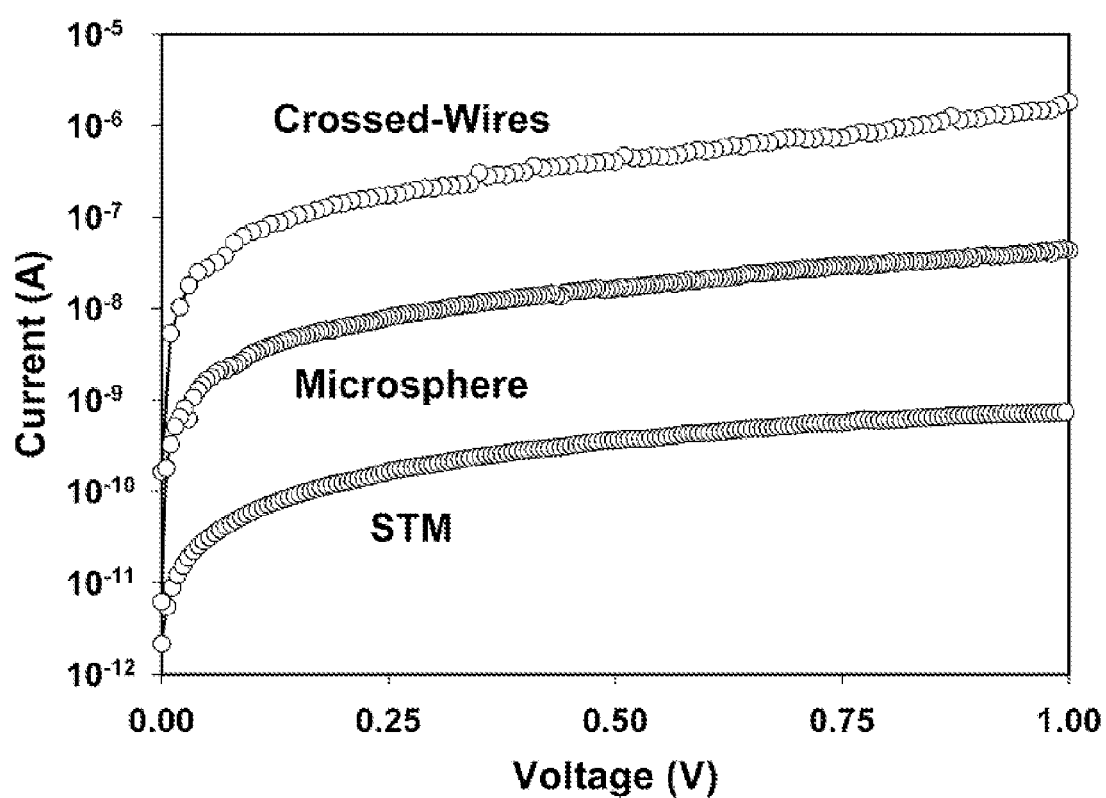
FIG. 6 shows I-V characteristics of OPE acquired using scanning tunneling microscopy (STM), microsphere, and crossed-wire test beds.

Another evaluation of microsphere molecular junctions was performed by comparing the single-bead OPE results to those of previous techniques in order to properly place this system in perspective with established methods. FIG. 6 shows I-V characteristics of OPE acquired using STM, microsphere, and crossed-wire test beds. On the lower end of the logarithmic scale STM results are shown for an individual OPE molecule isolated in a matrix of insulating SAM of alkanethiol. Three orders of magnitude above the individual OPE curve lies data from a crossed-wire experiment known to sample approximately 1000 molecules. Results from an OPE microsphere junction is found to lie intermediate between these two methods. From this comparison, and a similar one using OPV data, the microsphere junctions are calculated to incorporate approximately 60-100 OPE and OPV molecules. When compared to the independent estimate for the number of C-11 molecules (150-300) fewer molecules are found within the OPE/OPV junctions as compared to their alkanethiol counterparts. We attribute this decrease to lower packing density of the π-conjugated species. From the combined C-11, OPE, and OPV data, it is estimated that 1.5 μm diameter microsphere junctions are in contact with 100-300 individual molecules covering approximately 60 $nm^2$ area on the magnetic electrodes.

Obviously, many modifications and variations of the present invention are possible in light of the above teachings. It is therefore to be understood that the claimed invention may be practiced otherwise than as specifically described.

What is claimed is:

1. A device comprising:
    a substrate;
    a pair of ferromagnetic leads on a surface of the substrate, laterally separated by a gap; and
    one or more ferromagnetic microparticles comprising a conductive coating at least partially within the gap;
        wherein the conductive coating forms at least part of an electrical connection between the leads.

2. The device of claim 1, wherein the gap is no more than about 5 μm wide.

3. The device of claim 1, wherein the microparticle is larger than the gap and a single particle is within the gap and is in electrical contact with both leads.

4. The device of claim 1, wherein the microparticle comprises a microsphere, a ferromagnetic coating on the microsphere, and a conductive coating on the ferromagnetic coating.

5. The device of claim 4, wherein the ferromagnetic coating and the conductive coating cover only one hemisphere of the microsphere.

6. The device of claim 4,
    wherein the microsphere comprises silica;
    wherein the ferromagnetic coating comprises nickel; and
    wherein the conductive coating comprises gold.

7. The device of claim 4, wherein the leads comprise permalloy metal and a gold coating.

8. The device of claim 1, wherein at least one monolayer of electrically active molecules is in contact with at least one of the leads and with at least one of the microparticles.

9. The device of claim 8;
    wherein a single particle is within the gap;
    wherein the monolayers of electrically active molecules are coated on both of the leads and are in contact with the single particle;
    wherein the leads, the conductive coating, or both comprise gold; and
    wherein the electrically active molecule comprises a sulfur atom bound to the gold.

10. The device of claim 8, wherein the electrically active molecule is selected from the group consisting of a compound having conjugated bonds, 1-undecanethiol, oligo (phenylene vinylene)dithiol, and oligo(phenylene ethynylene)dithiol.

* * * * *